United States Patent [19]

Dressler

[11] Patent Number: 4,466,118
[45] Date of Patent: Aug. 14, 1984

[54] DUAL RANGE AUDIO LEVEL CONTROL

[75] Inventor: Roger W. Dressler, Pleasant Hill, Calif.

[73] Assignee: Motorola, Inc.

[21] Appl. No.: 444,929

[22] Filed: Feb. 1, 1983

[51] Int. Cl.³ .......................... H03G 5/14; H04B 1/16
[52] U.S. Cl. .................................. 381/102; 455/267; 333/28 T; 330/126
[58] Field of Search .................. 381/102, 103, 109, 61; 455/267; 333/28 R, 28 T; 330/126

[56] References Cited

U.S. PATENT DOCUMENTS

| | | | |
|---|---|---|---|
| 3,700,811 | 10/1972 | Davidson | 381/102 |
| 3,849,601 | 11/1974 | Goncharoff | 333/28 T |
| 3,875,334 | 4/1975 | Hilbert et al. | 333/28 T |
| 4,227,048 | 10/1980 | Nagata | 333/28 T |
| 4,292,467 | 9/1981 | Odlen et al. | 381/102 |
| 4,320,534 | 3/1982 | Sakai et al. | 381/102 X |

Primary Examiner—A. D. Pellinen
Assistant Examiner—James L. Dwyer
Attorney, Agent, or Firm—Margaret Marsh Parker; James W. Gillman; James S. Pristelski

[57] ABSTRACT

A circuit providing a known change in a parameter of a function without interfering with the basic operation of the function is utilized in an audio circuit "loudness contour" control. Bass and treble controls function independently of the volume setting while desired contours are obtained at each volume control setting.

4 Claims, 4 Drawing Figures

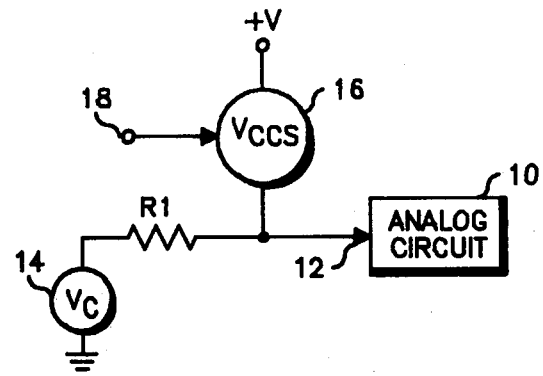
*Fig. 1*
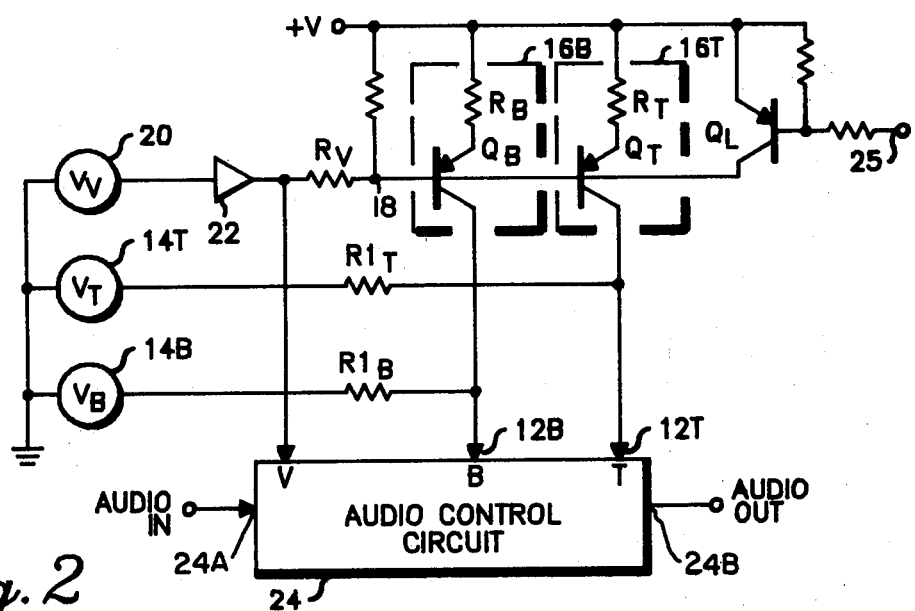
*Fig. 2*
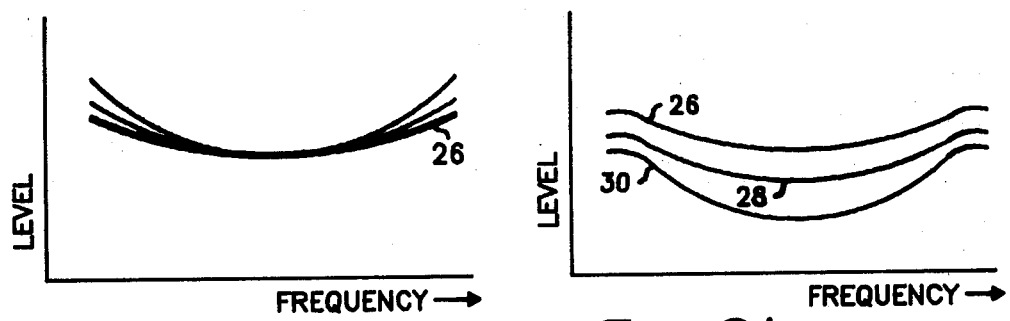
*Fig. 3a*  *Fig. 3b*

DUAL RANGE AUDIO LEVEL CONTROL

BACKGROUND OF THE INVENTION

This invention relates to the field of voltage controlled functions and, more particularly, to circuits providing dual independent frequency response control for audio circuits.

It is well known in the art of audio devices that two characteristics are considered necessary by audio system purchasers and users. One is the ability to adjust bass and treble boosts to suit the user's aural taste. The other is the need to boost at least the bass frequencies as the volume control is turned down to compensate for the decreased sensitivity of the human ear at lower audio levels. The problem in the past has been to provide both these characteristics at the same time, but independently. In earlier circuits it was possible to accomplish the dual range control with audio devices having separate rotary potentiometers controlling volume, bass, treble and balance with simple RC networks which could be switched into each circuit to add the "loudness" function. With the increasing use of new IC's which include, on one chip, all of the four above-mentioned functions, coupled to merely rotary controls, it is no longer a simple matter to provide independent controls along with optimum loudness contour. Many attempts have been made to provide for varying contours, but in most instances the "loudness switch" merely brings the bass boost or bass and treble boosts up to a fixed value regardless of the volume control setting.

SUMMARY

It is, therefore, an object of the present invention to provide a dual range audio level control.

It is a particular object to provide a dual range control wherein a change in one range has no effect on the other.

It is a specific object to provide the above features in a circuit utilizing a "stereo sound control system" integrated circuit chip.

These objects and others which will become apparent are obtained by adding to a circuit such as a bass boost tone control, a voltage-controlled current source and a resistor. The current source is controlled by a voltage from the volume control circuit and the resulting voltage drop across the resistor is added to the voltage from the bass control potentiometer. The same circuitry may be included in the treble control circuit.

BRIEF DESCRIPTION OF THE DRAWINGS

FIG. 1 is a block diagram of an isolated dual range control circuit.

FIG. 2 is a schematic diagram of a complete audio circuit including the circuit of FIG. 1.

FIGS. 3a and 3b are charts illustrating the dual ranges.

DETAILED DESCRIPTION OF THE PREFERRED EMBODIMENT

In the block diagram of FIG. 1, an analog circuit 10, which could be an audio circuit, requires a control voltage to be coupled to a high impedance input terminal 12. The control voltage is supplied by a variable voltage source ($V_c$) 14 and is coupled through a resistor R1 which may be the source resistance of the source 14 or could include any desired additional resistance. Coupled to the terminal 12 is a variable current source (VCCS) 16 which may be voltage controlled from a control voltage input terminal 18.

When the current source 16 is turned off, no voltage drop occurs across the resistor R1 since essentially no current flows in the circuit due to the high input impedance of the analog circuit 10. The voltage at the input terminal 12 is therefore essentially the voltage determined by the voltage source 14. As the current source 16 begins to supply current, in response to the voltage supplied to the control terminal 18, a voltage drop begins to appear across resistor R1 and this voltage is added to the voltage supplied from voltage source 14, the combined voltages appearing at terminal 12. It will be seen that the added voltage is not a function of the voltage from the voltage source 14.

In FIG. 2 the circuit of FIG. 1 may be utilized twice in an audio "loudness contour" application wherein the control voltage at the terminal 18 is derived from a volume control ($V_v$) 20, coupled through a buffer amplifier 22 if necessary and resister $R_v$ to the bases of transistors $Q_B$ and $Q_T$. The current source 16T for the treble control includes transistor $Q_T$ and resistor $R_T$. The current source 16B for the bass control includes transistor $Q_B$ and resistor $R_B$.

A treble control ($V_T$) 14T is coupled through resistor $R1_T$ to a treble input control terminal 12T of an audio control circuit 24 which is analagous to the circuit 10 of FIG. 1. The circuit 24 will have an audio input terminal 24A and an audio output terminal 24B. The circuit 24 may be an LM 1035 manufactured by National Semi Conductor Company, or may be a TCA5550, an IC manufactured by Motorola Inc. In the latter case, the buffer amplifier 22 would be a linear inverter, and the volume control input to the IC would be connected directly to the volume control 20. The control $V_T$ then operates independently as far as the user is aware. However, when the volume is turned down by way of the volume control 20, the voltage on the base of the transistor $Q_T$ is reduced and the current through $Q_T$ increases. Since essentially all of that current flows through resistor $R1_T$, the voltage at the terminal 12T is the sum of the voltage drop across resistor $R1_T$ and the voltage supplied by treble control 14T. Likewise, the bass control 14B can be operated by the user to run the bass frequency response up and down independently of the volume control 20. However, when the volume control 20 is turned down, the lower voltage from the buffer amplifier 22 is applied to the base of $Q_B$, allowing more current to flow from the bass current source 16B. The increased current flowing through the resistor $R1_B$ increases the voltage supplied to the bass control input terminal 12B. Thus, as is desirable, there is an automatic bass boost as the volume is turned down. Also, since the treble and bass boosts are functions of resistors $R1_T$ and $R1_B$ respectively, the automatic bass boost can be made larger than the treble boost, as is usually desired, by the resistance values chosen.

To provide the function usually called a "loudness contour" control, a transistor $Q_L$ is coupled to enable/disable the voltage controlled current sources 16B, 16T when a voltage of the proper level is applied to an input terminal 25. The "loudness" switch itself (not shown), which supplies the voltage at the terminal 25 is typically on the control panel of the audio device and is, like the rotary controls, operated by the user as desired.

In FIGS. 3a and 3b the effects on "loudness contour" may be observed. FIG. 3a illustrates three possible contours at a single volume control setting; that is, the bass and treble frequencies are indicated at three possible levels each while the mid-frequencies remain essentially unchanged. The bold line 26 is also seen in FIG. 3b. In FIG. 3b the settings of the bass control 14B and the treble control 14T are not being changed from curve to curve, but the volume control 20 is set lower for line 28 and still lower for line 30. As may be seen, with the lower volume control settings, bass and treble frequencies are boosted. This type of boost is intended to compensate for the extra "fall-off" of sensitivity in the human ear at those frequencies at low sound levels. No scale should be assumed in FIGS. 3a and 3b.

Thus there has been shown and described a simple yet accurate means of effecting a change in a control voltage without affecting the normal functioning of that control voltage. This principle can then be utilized in a "loudness contour" circuit to provide independently functioning bass and treble controls which are additionally adjusted by the volume control, thus combining all desirable loudness contour adjustments with the dual range control. Other variations and modifications of the invention are possible and it is intended to cover all such as fall within the spirit and scope of the appended claims.

What is claimed is:

1. A dual range level control comprising:
   an analog circuit having multiple input terminals for receiving separate control voltages and having high input impedances;
   a first controllable voltage source;
   a first resistive element coupled between the first input terminal and the first controllable voltage source;
   a first controllable current source coupled to the first input terminal;
   a second controllable voltage source;
   a second resistive element coupled between the second input terminal and the second controllable voltage source;
   a second controllable current source coupled to the second input terminal;
   an third controllable voltage source coupled to a third input terminal and to the first and second controllable current sources for controlling said current sources; and
   an enabling circuit having an input terminal for receiving an external control signal and an output coupled to provide an enabling signal to said current sources.

2. A dual range level control in accordance to claim 1 and wherein the analog circuit includes an input terminal for receiving an audio signal and circuitry for processing the volume, the bass frequencies and the treble frequencies of said audio signal, and an output terminal for outputting the processed audio signal.

3. A dual range level control according to claim 1 and wherein each of the first and second controllable current sources includes a resistive element, coupled to a power source, and a transistor, the base of each transistor being coupled to the third controllable voltage source.

4. A dual range level control according to claim 1 and wherein the enabling circuit includes a transistor having the transistor base coupled to the input terminal of the enabling circuit and another transistor element coupled to the third controllable voltage source.

* * * * *